United States Patent [19]
Hanneberg et al.

[11] Patent Number: 5,925,905
[45] Date of Patent: Jul. 20, 1999

[54] MOS CIRCUIT CONFIGURATION FOR SWITCHING HIGH VOLTAGES ON A SEMICONDUCTOR CHIP

[75] Inventors: Armin Hanneberg, Haar; Georg Tempel, München, both of Germany

[73] Assignee: Siemens Aktiengesellschaft, Munich, Germany

[21] Appl. No.: 08/899,746

[22] Filed: Jul. 24, 1997

Related U.S. Application Data

[63] Continuation of application No. PCT/DE95/01875, Dec. 29, 1995.

[30] Foreign Application Priority Data

Jan. 24, 1995 [DE] Germany ............................ 195 02 116
Dec. 29, 1995 [WO] WIPO ........................ PCT/DE95/1875

[51] Int. Cl.$^6$ ............................................. H01L 29/772
[52] U.S. Cl. ........................................... 257/299; 257/314
[58] Field of Search .................................. 257/314–326, 257/499–502, 544–556, 299

[56] References Cited

U.S. PATENT DOCUMENTS 5,077,691 12/1991 Haddad et al. .
5,335,200 8/1994 Coffman et al. .
5,371,705 12/1994 Nakayama et al. .

FOREIGN PATENT DOCUMENTS

0456623A2 11/1991 European Pat. Off. .
1807105 3/1970 Germany .

OTHER PUBLICATIONS

A 60nc 16Mb Flash EEPROM with Program and Erase Sequence Controller (Nakayama et al.), 1991 IEEE International Solid–State Circuits Conference, pp. 260, 261 and 326.

Primary Examiner—David B. Hardy
Attorney, Agent, or Firm—Herbert L. Lerner; Laurence A. Greenberg

[57] ABSTRACT

The MOS circuit configuration allows switching high voltages on a semiconductor chip. In order to switch a high negative voltage, for example as a programming voltage on the word line of a flash-memory, two circuit variants are given which are formed only with transistors of the same conductivity type as the substrate. The substrate and the transistors formed in the well are p-conductive. In this way it is possible to dispense with deep insulating wells which require special technology.

9 Claims, 4 Drawing Sheets

MOS CIRCUIT CONFIGURATION FOR SWITCHING HIGH VOLTAGES ON A SEMICONDUCTOR CHIP

CROSS-REFERENCE TO RELATED APPLICATION

This application is a continuation of copending international application PCT/DE95/01875, filed Dec. 29, 1995, which designated the United States.

BACKGROUND OF THE INVENTION

FIELD OF THE INVENTION

When electronic circuits are embodied as integrated circuits on a semiconductor chip it is sometimes necessary to connect higher voltages than the supply voltage and also to connect negative voltages on the chip to the circuits or parts thereof. In this context, the high positive or negative voltages can either be fed to the chip in addition to the customary supply voltages or be produced from the supply voltages by means of charge pumps on the chip. At all times it is necessary to ensure reliable and rapid switching, and the voltage drop across the switch is to be kept as low as possible.

Thus, it is necessary in the new kind of flash memories, and also in the future in standard EEPROMs, to connect a negative word line voltage to a word line in order to select it. In this case, non-selected word lines are kept at a potential of 0V.

In accordance with U.S. Pat. No. 5,319,604 (EP 0 456 623 A2), the gate of a p-MOS transfer transistor is negatively poled with a pulsed, high positive voltage by means of a capacitor in a voltage inverting circuit. The result is that the negative voltage passes from a charge pump to the word line of a memory. Because of leakage currents in the connections, this circuit must be operated in the burst mode. This means that repeating pulses are necessary up to the end of the programming operation, resulting in a relatively high power loss.

Since the logic circuits which are usually also present on a memory chip in addition to the memory cells are also realized using MOS technology and such circuits are thus operated on a standard basis with purely positive voltages, insulation of the negative voltage with respect to the substrate of the semiconductor chip must be ensured. This can be achieved, for example, by means of insulated wells, using so-called "triple-well" technology.

In a p-type substrate a p-well for n-channel transistors is formed thereby in a deep n-well and thus insulated from the p-type substrate. Such a deep well is obtained, for example, by means of a high-energy implantation with typically 1 to 3 MeV with phosphorus as the doping material or by means of lower energy and during an extremely long diffusion time.

SUMMARY OF THE INVENTION

It is accordingly an object of the invention to provide an MOS circuit configuration for switching high voltages on a semiconductor chip, which overcomes the above-mentioned disadvantages of the heretofore-known devices and methods of this general type and which allows switching of high negative voltages, and as a refinement also positive high voltages, by means of purely positive switching levels on the semiconductor chip, and, as a further object, the MOS circuit configuration should not require any insulated well or wells.

With the foregoing and other objects in view there is provided, in accordance with the invention, a MOS circuit configuration for switching high voltages on a semiconductor chip, comprising:

a p-type substrate, an n-well formed in the substrate, and a plurality of p-conductive transistors formed in the n-well;

a first terminal for positive voltages, and a second terminal for a high negative voltage;

the plurality of transistors including a first transistor having a load path and a gate, and a second transistor having a gate, the first and second transistors being connected in series between the first terminal and the second terminal and being mutually connected to a node formed therebetween;

the plurality of transistors further including a third transistor having a gate and a fourth transistor having a gate, the third and fourth transistors being connected in series between the first terminal and the second terminal and being mutually connected to a node forming an output terminal;

wherein the first transistor and the third transistor are directly connected to the first terminal, the gate terminal of the second transistor and the gate terminal of the fourth transistor are connected to the second terminal, the gate terminal of the first transistor is connected to the node forming the output terminal, and the gate terminal of the third transistor is connected to the node between the first and second transistors;

the plurality of transistors further including a fifth transistor having a load path connected in parallel with the load path of the first transistor and a gate forming a control terminal receiving an input signal;

the transistors being dimensioned such that, when a positive voltage is applied to the first terminal, a negative voltage is applied to the second terminal, and a positive voltage is applied to the control terminal, the node between the first and second transistors is first drawn to the second terminal.

In accordance with an added feature of the invention, the circuit further comprises a terminal receiving an inverted input signal and a further control terminal receiving the input signal, a sixth transistor with a load path connected in parallel to a load path of the third transistor, a seventh transistor having a gate and a load path, and an eighth transistor having a gate and a load path; the sixth transistor having a gate terminal connected through the load path of the eighth transistor to the terminal receiving the inverted input signal, the gate of the eighth transistor being connected to the further control terminal; the load path of the seventh transistor being connected between the first terminal and the gate terminal of the sixth transistor, and the gate of the seventh transistor being connected to the output terminal; and the sixth and seventh transistors being p-conductive and being formed in a well, and the eighth transistor being an n-conductive transistor.

With the above and other objects in view there is also provided, in accordance with the invention, a MOS circuit configuration for switching high voltages on a semiconductor chip, comprising:

a p-type semiconductor substrate, at least one well formed in the substrate, and a plurality of p-conductive transistors formed in the at least one well;

a first input terminal for a high positive voltage pulse, a second terminal for a high negative voltage, and an output terminal;

the plurality of transistors including a first transistor having a gate and a load path connected between an output terminal and a second terminal for a high negative voltage;

a second transistor having a gate and a load path connected between the gate of the first transistor and the second terminal;

a third transistor having a load path connected in parallel with the load path of the second transistor, and mutually connected gate and source terminals;

and a voltage-inverting circuit connected between the gate terminal of the second transistor and the terminal for the high positive voltage pulse.

In accordance with an additional feature of the invention, the circuit further comprises a control terminal for an input signal and a control terminal for an inverted input signal, and a fourth transistor having a gate connected to the control terminal for the input signal and a load path connected between the gate terminal of the second transistor and the control terminal for the inverted input signal, and the fourth transistor being p-conductive and being formed in a well.

In accordance with a further feature of the invention, the voltage inverting circuit includes a capacitor having a first terminal connected to the terminal for the high positive voltage pulse and a second terminal, a fifth transistor connected as a diode with a polarity in the conducting direction between the second terminal of the capacitor and ground, and a sixth transistor connected as a diode with a polarity in the blocking direction, to an output terminal of the voltage-inverting circuit, and the fifth and sixth transistors being p-conductive and being formed in a well.

In accordance with a concomitant feature of the invention, there is also provided a circuit configuration for switching high positive voltages, a seventh transistor connecting the output terminal to the circuit configuration for switching high positive voltages, and a control terminal for a control signal connected to a gate of the seventh transistor.

A particular advantage of the circuit configuration according to the invention lies in the fact that expensive systems or relatively long baking times in a diffusion processing step are not necessary for its technological realization. No further process steps are necessary either since in CMOS technology the transistors of the same conductivity type as the substrate are already realized in a well and thus such a process step is already present for the realization of CMOS technology.

The circuit configuration according to the invention is particularly suitable for switching negative programming or gate turnoff voltages, or in a refinement thereof also of positive programming or gate turnoff voltages, to the word lines of a flash memory or else of an EEPROM memory. It is thereby possible to select only one word line in each case.

Other features which are considered as characteristic for the invention are set forth in the appended claims.

Although the invention is illustrated and described herein as embodied in a MOS circuit configuration for switching high voltages on a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
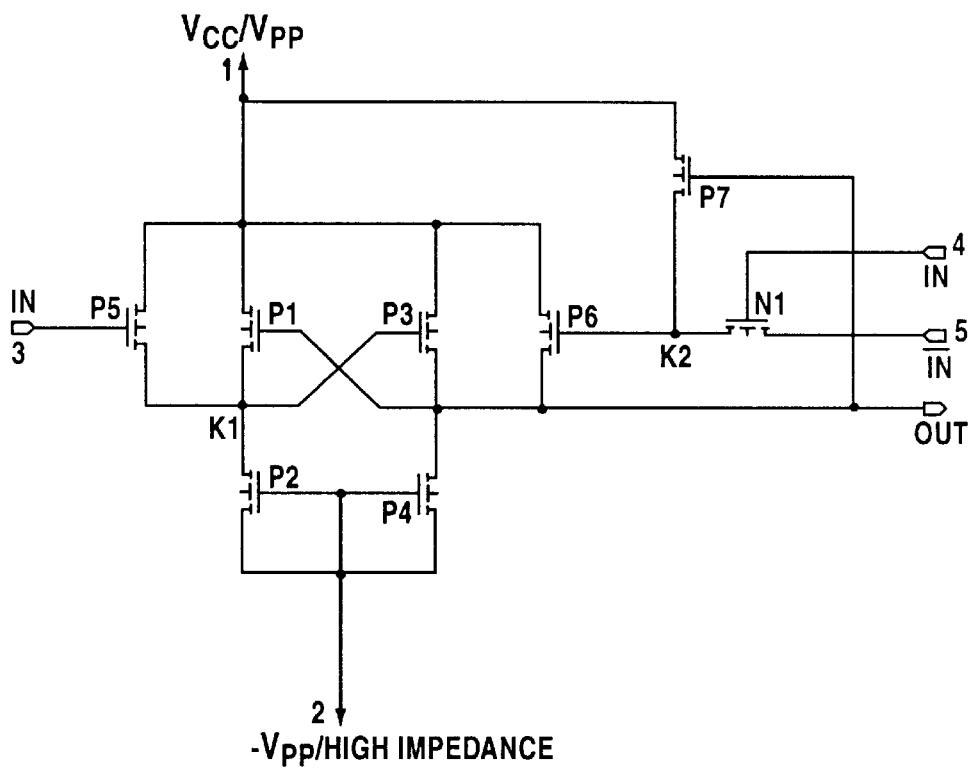
FIG. 1 is a diagram of a first exemplary embodiment of a circuit configuration according to the invention.

Referring now to the figures of the drawing in detail and first, particularly, to FIG. 1 thereof, there is seen a circuit configuration that makes it possible to switch either a high voltage Vpp which is applied to a first terminal 1 or a high negative voltage −Vpp which is added at a second terminal 2 to an output terminal OUT as a function of an input signal IN, $\overline{\text{IN}}$ at control terminals 3, 4, 5. The example relates to a realization of the circuit configuration as an integrated circuit in a p-type substrate with p-channel transistors constructed in n-wells. Of course, n-channel transistors could be realized in an equivalent way in an n-type substrate.

A first series circuit formed by a first transistor P1 and a second transistor P2 and, parallel thereto, a second series circuit formed by a third transistor P3 and a fourth transistor P4 are disposed between the first terminal 1 and the second terminal 2. The gate terminals of the second and fourth transistors P2, P4 are likewise connected to the second terminal 2 so that the two transistors P2, P4 function as current sources realized with diodes. The gate terminal of the third transistor P3 is connected to a node K1 between the first and second transistors P1, P2 and the gate terminal of the first transistor P1 is connected to the node, forming the output terminal OUT, between the third transistor P3 and fourth transistor P4. The transistors P1 to P4 are dimensioned here in such a way that, in the event that the second and the fourth transistors P2, P4 are switched to their conductive state, the node K1 of the first and second transistors P1, P2 is first of all drawn to the second terminal 2 so that the third transistor P3 conducts and thus draws the output terminal OUT to the positive potential present at the first terminal 1, with the result that the first transistor P1 blocks. The load path of a fifth transistor P5 is connected parallel to transistor P1. The gate terminal of this fifth transistor P5 is connected to the control terminal 3.

Figure 3:
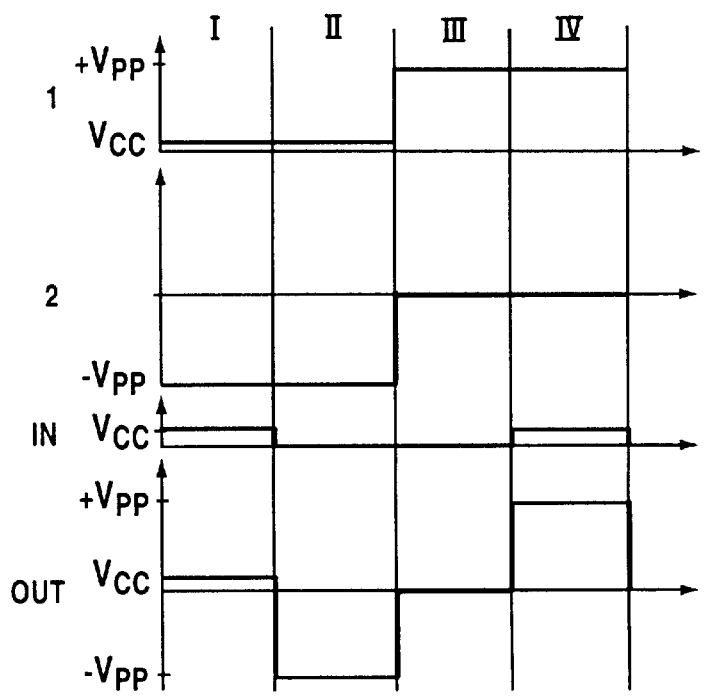
FIG. 3 is a voltage chart illustrating the various voltages to be applied to the first embodiment of FIG. 1 in order to obtain a desired output voltage.

With this part of the circuit configuration illustrated in FIG. 1 it is already possible to switch a high negative voltage −Vpp, which is applied to the terminal 2, to the output terminal OUT by means of an input signal IN which is applied to the control input 3, if the semiconductor chip supply voltage Vcc is present at the first terminal 1. This is illustrated in FIG. 3 in the time intervals identified by I and II. As long as the state of the input signal IN at the control input 3 corresponds to a logic high state, that is to say therefore corresponds approximately to the value of the positive supply voltage Vcc in CMOS circuits, the fifth transistor P5 blocks. Since the second and the fourth transistors P2, P4 conduct, owing to the suitable dimensioning of the transistors P1 to P4 the node K1 of the first and the second transistors is drawn to the potential -Vpp at the second terminal 2 so that the third transistor P3 conducts and thus draws the output terminal OUT to the supply voltage potential Vcc, which is present at the first terminal 1, as a result of which the first transistor P1 blocks and the circuit configuration is thus locked in this state. This state is illustrated in the time period I in FIG. 3. If, as is shown in time period II of FIG. 3, the state of the input signal IN at the control input 3 changes to a logic low state, that is to say therefore assumes a value of 0V, the fifth transistor P5 conducts, as a result of which the node K1 is drawn to the supply voltage potential Vcc and thus the third transistor P3 blocks. Owing to the conductive fourth transistor P4, the output terminal OUT is now drawn to the high negative potential -Vpp present at the second terminal 2, as a result of which the first transistor P1 also conducts and the circuit is thus locked in this state.

If the intention is also that a high positive voltage Vpp which is present at the first terminal 1 should be capable of being switched through to the output terminal OUT, the previously described circuit must be supplemented in accordance with the circuit configuration illustrated in FIG. 1. For this purpose, the load path of a sixth transistor P6 is connected in parallel with the load path of the third transistor P3. The load path of a seventh transistor P7, whose gate terminal is connected to the output terminal OUT, is connected between the first terminal 1 and the gate terminal of the sixth transistor P6. The gate terminal of the sixth transistor P6 is connected via the load path of a first n-channel transistor N1 to a control input 6 for an inverted input signal $\overline{IN}$. The gate terminal of the first n-channel transistor N1 is connected to a control terminal 4 for the input signal IN. The gate terminal of the first n-channel transistor N1 could, of course, equally well be connected to the control terminal 3. Since the first n-channel transistor N1 cannot come into contact at any of its terminals with the high negative potential -Vpp, it is not necessary to construct it in a deep well. In order to switch through a high positive voltage Vpp to the output terminal OUT, the voltage is applied to the first terminal 1 instead of the supply voltage Vcc. The second terminal 2 is kept in a floating state, which can either take place by switching off the source for the high negative potential -Vpp or as a result of the output of this source assuming a state of high impedance.

As long as the input signal IN continues to assume a logical low state L, the output terminal OUT remains connected to the second terminal 2 via the fourth transistor P4 and is thus likewise in a floating state. This is illustrated in the time period III in FIG. 3. However, if the input signal IN assumes a logical high state H, then the fifth transistor P5 blocks again while the first n-channel transistor N1 switches through and a logical low state is thus applied to the gate of the sixth transistor P6. As a result, P6 becomes conductive and draws the output terminal OUT to the high positive potential Vpp present at the first terminal 1. As a further result, the seventh transistor P7 reliably blocks so that the sixth transistor P6 remains in the conductive state. This case is illustrated in the time period IV in FIG. 3.

When the circuit configuration according to the invention illustrated in FIG. 1 is used in a flash memory, each word line is assigned such a circuit configuration and a high positive voltage Vpp which is present at the first terminal 1 or a high negative voltage -Vpp which is present at the second terminal 2 can be applied to the output terminal OUT of the circuit configuration by means of the selection of the state of the input signal IN, and the required gate turnoff voltage or programming voltage can thus be applied to the particular word line of the flash memory.

Figure 2:
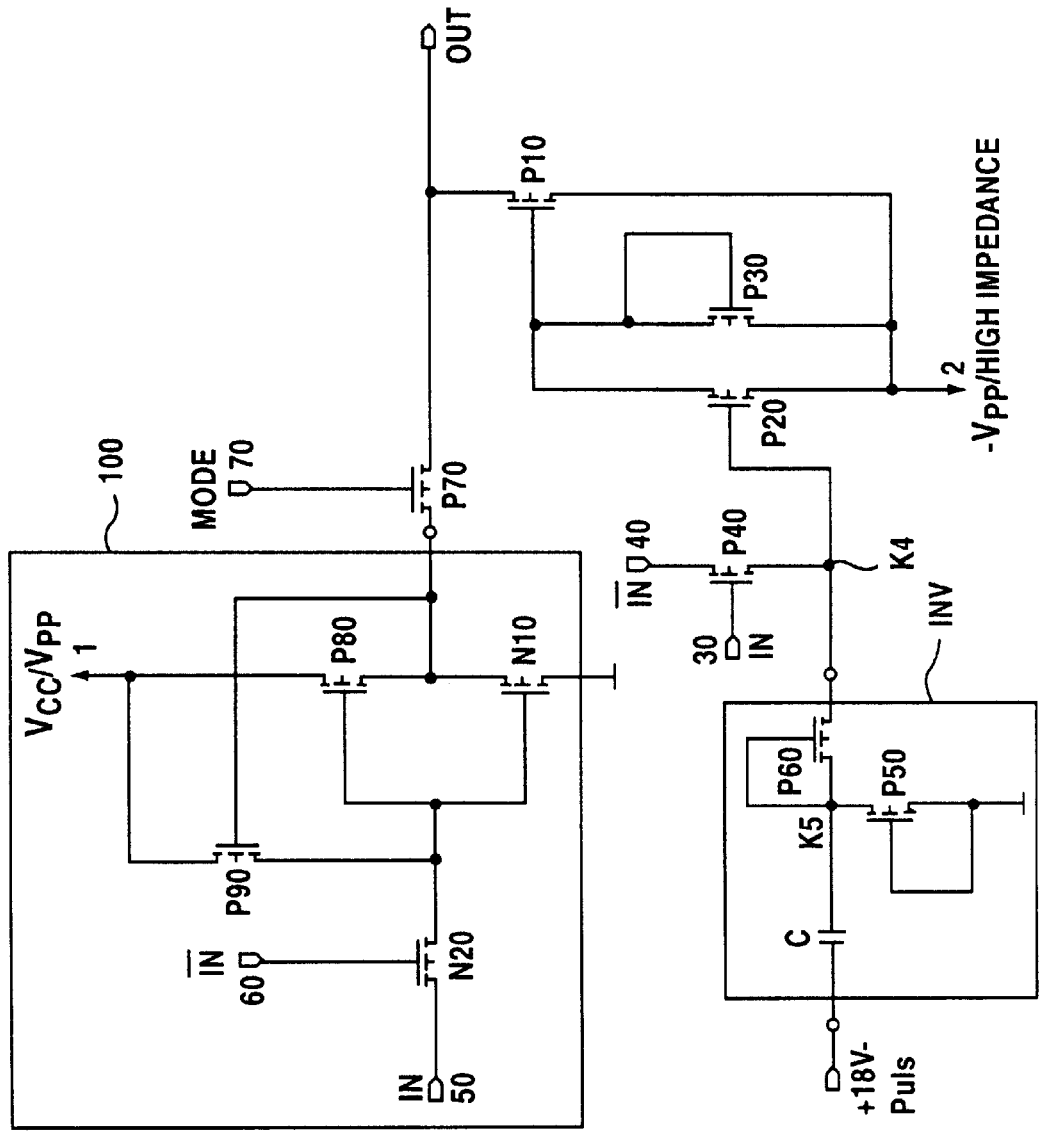
FIG. 2 is a schematic diagram of a second embodiment of the circuit configuration according to the invention.
Figure 4:
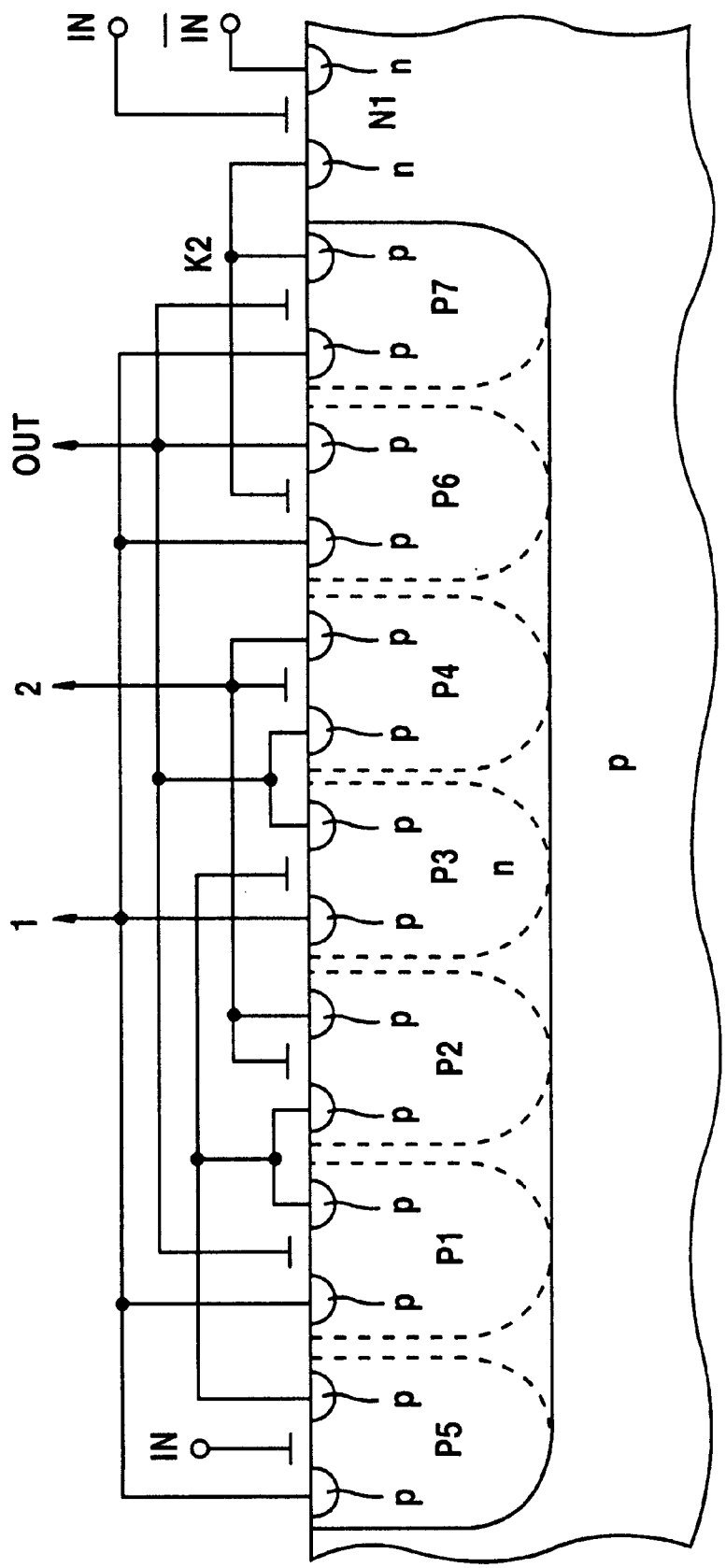
FIG. 4 shows a realization in a semiconductor substrate of the circuit shown in FIG. 1, illustrating the p-channel transistors embodied in a single n-type well shown by a solid line and alternatively illustrating the p-channel transistors embodied multiple n-type wells as shown by dashed lines.
Figure 5:
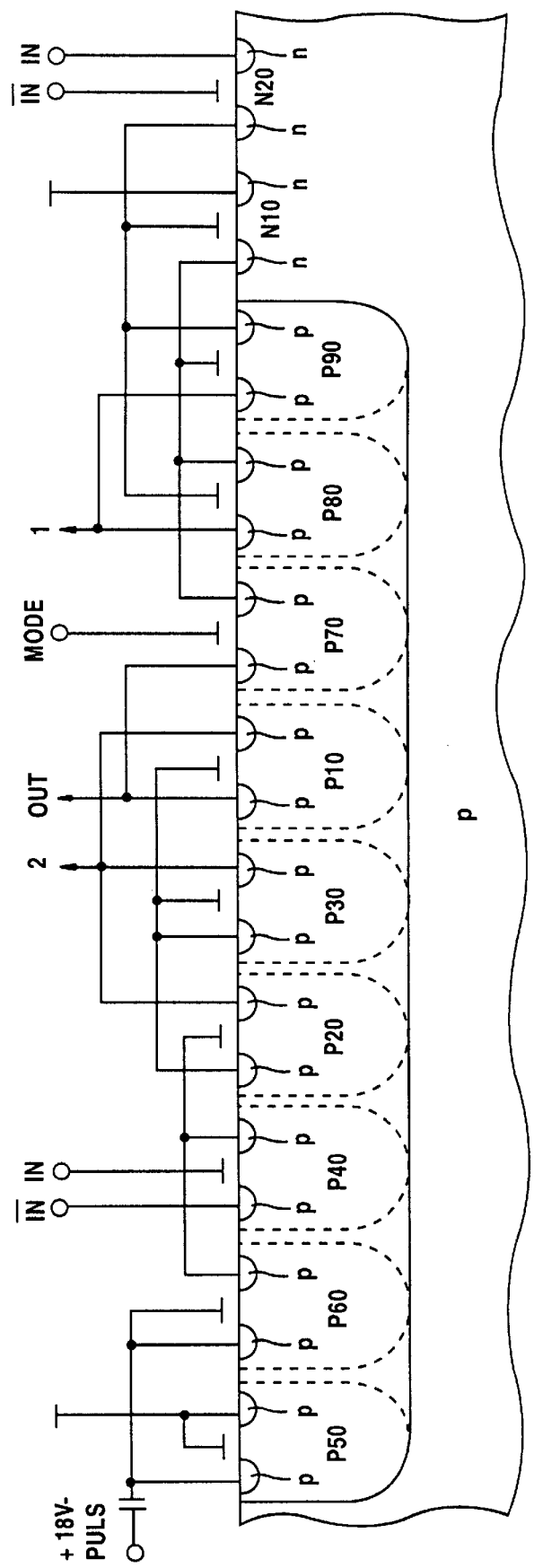
FIG. 5 shows a realization in a semiconductor substrate of the circuit shown in FIG. 2, illustrating the p-channel transistors embodied in a single n-type well shown by a solid line and alternatively illustrating the p-channel transistors embodied multiple n-type wells as shown by dashed lines.

Referring now to FIG. 2, there is shown a further circuit configuration according to the invention with which either a high positive voltage Vpp or a high negative voltage -Vpp can be switched to an output terminal OUT of this circuit configuration. Which of the voltages is switched through depends in turn on which state an input signal IN to control inputs 3 to 6 for this input signal IN or the inverted input signal $\overline{IN}$ assumes and on the state of a control signal MODE which is present at a further input terminal 7. In this variant also, all the transistors which can come into contact with the high negative voltage -Vpp are of the same conductivity type as the substrate. In the example of FIG. 2, where a p-type substrate is assumed these are therefore the p-channel transistors shown there. The load path of a first transistor P10 is connected between the output terminal OUT and the second terminal 2 for the high negative potential -Vpp. The load path of a second transistor P20 is connected between the gate terminal of this first transistor P10 and the second terminal 2 and the load path of a third transistor P30 is connected in parallel to the second transistor P20. The gate terminal of the third transistor P30 is connected to its source terminal so that this transistor is switched as a diode. If a high negative voltage is applied to the gate terminal of the second transistor P20, the second transistor P20 switches through, as a result of which the gate terminal of the first transistor P10 is drawn to the high negative potential -Vpp present at the second terminal 2. As a result, on the one hand the first transistor P10 switches through, the high negative potential -Vpp thereby being switched through to the output terminal OUT, and on the other hand the third transistor P30, which is switched as a diode, begins to conduct, the gate terminal of the first transistor P10 thereby being kept at the high negative potential -Vpp. As a result it is possible to supply only a pulsed negative voltage to the gate terminal of the second transistor P20. The pulsed negative voltage is produced from a high positive voltage pulse of approximately 18V by means of a voltage-inverting circuit INV. This voltage-inverting circuit INV is formed in a conventional manner by means of a capacitor C which is connected in series with a fifth transistor P50, which is connected as a diode with its polarity in the conducting direction, and a sixth transistor P60 which is connected as a diode with its polarity in the blocking direction and which is connected to the node of the capacitor C and the fifth transistor P50. The terminal of the capacitor C which is not connected to the transistors P50, P60, forms the input terminal and the anode of the diode P60 with its polarity in the blocking direction forms the output terminal of the voltage-inverting circuit INV.

If one of a plurality of word lines is to be supplied with a negative programming voltage, for example in a flash memory, each of the word lines can be connected to an output terminal of such a circuit according to the invention. In order to select one of the circuit configurations, either the positive (for example 18V-) voltage pulse can be applied to the circuit configuration to be selected or else the gate terminal of the second transistor P20 can be connected via the load path of a fourth transistor P40 to a control terminal 40 which is supplied with an inverted input signal $\overline{IN}$. The gate terminal of this fourth transistor P40 is connected here to an input terminal 30 which is supplied with a non-inverted input signal IN. If the input signal IN assumes a high state H, the fourth transistor P40 blocks so that the negative voltage pulse is switched through by the output of the voltage-inverting circuit INV to the gate terminal of the second transistor P20. However, if the input signal IN assumes a logic low state, the fourth transistor P40 conducts so that the negative voltage pulse is conducted away from the output of the voltage-inverting circuit INV to the input terminal 40 via the fourth transistor P40. By selecting the state of the input signal IN at the circuit configurations assigned to the various word lines of a flash memory, one of the circuit configurations, and hence one of the word lines, can thus be selected.

Furthermore, FIG. 2 shows a circuit configuration 100 for switching a high positive voltage Vpp to the output terminal OUT, such as is known for example from the publication Proceedings ISSCC 1991, p. 260. The output of this circuit is connected via a seventh transistor P70 to the output terminal OUT, the gate terminal of the seventh transistor P70 being connected to an input terminal 70 for a control signal MODE. If a high negative voltage −Vpp is to be switched to the output terminal OUT, the control signal MODE must assume a logic high state at the input terminal 70 so that the seventh transistor P70 blocks and thus the high negative voltage −Vpp is insulated from the circuit configuration 100 for switching high positive voltages since the latter also has n-channel transistors which are not intended to be constructed in deep insulating wells.

In the circuit configuration for switching high positive voltages the series circuit formed by an eighth transistor P80 and a first n-channel transistor N10 is connected between a first terminal 1 for positive voltages and a ground terminal. The gate terminals of these two transistors are connected to one another and, via the load path of a second n-channel transistor N20, to a control terminal 50 to which an input signal IN can be applied. The gate terminal of this second n-channel transistor N20 is connected to an input terminal 60 to which an inverted input signal can be applied. The node of the eighth transistor P80 and the first n-channel transistor N10 forms the output terminal of this circuit configuration 100 for switching high positive voltages and is connected to the gate terminal of a ninth transistor P90 whose load path is arranged between the first terminal 1 and the node of the gate terminals of the eighth transistor P80 and of the first n-channel transistor N10.

We claim:

1. A MOS circuit configuration for switching high voltages on a semiconductor chip, comprising:

a p-type substrate, an n-well formed in said substrate, and a plurality of p-conductive transistors formed in said n-well;

a first terminal for positive voltages, and a second terminal for a high negative voltage;

said plurality of transistors including a first transistor having a load path and a gate, and a second transistor having a gate, said first and second transistors being connected in series between said first terminal and said second terminal and being mutually connected to a node formed therebetween;

said plurality of transistors further including a third transistor having a gate and a fourth transistor having a gate, said third and fourth transistors being connected in series between said first terminal and said second terminal and being mutually connected to a node forming an output terminal;

wherein said first transistor and said third transistor are directly connected to said first terminal, said gate terminal of said second transistor and said gate terminal of said fourth transistor are connected to said second terminal, said gate terminal of said first transistor is connected to said node forming said output terminal, and said gate terminal of said third transistor is connected to said node between said first and second transistors;

said plurality of transistors further including a fifth transistor having a load path connected in parallel with said load path of said first transistor and a gate forming a control terminal receiving an input signal;

said transistors being dimensioned such that, when a positive voltage is applied to said first terminal, a negative voltage is applied to said second terminal, and a positive voltage is applied to said control terminal, said node between said first and second transistors is first drawn to said second terminal.

2. The MOS circuit configuration according to claim 1, which further comprises:

a terminal receiving an inverted input signal and a further control terminal receiving the input signal, a sixth transistor with a load path connected in parallel to a load path of said third transistor, a seventh transistor having a gate and a load path, and an eighth transistor having a gate and a load path;

said sixth transistor having a gate terminal connected through said load path of said eighth transistor to said terminal receiving the inverted input signal, said gate of said eighth transistor being connected to said further control terminal;

said load path of said seventh transistor being connected between said first terminal and said gate terminal of said sixth transistor, and said gate of said seventh transistor being connected to said output terminal; and said sixth and seventh transistors being p-conductive and being formed in said n-well, and said eighth transistor being an n-conductive transistor.

3. MOS circuit configuration for switching high voltages on a semiconductor chip, comprising:

a p-type semiconductor substrate, at least one well formed in said substrate, and a plurality of p-conductive transistors formed in said at least one well;

a first input terminal for a high positive voltage pulse, a second terminal for a high negative voltage, and an output terminal;

said plurality of transistors including a first transistor having a gate and a load path connected between an output terminal and a second terminal for a high negative voltage;

a second transistor having a gate and a load path connected between said gate of said first transistor and the second terminal;

a third transistor having a load path connected in parallel with said load path of said second transistor, and mutually connected gate and source terminals;

and a voltage-inverting circuit connected between said gate terminal of said second transistor and said terminal for the high positive voltage pulse.

4. The MOS circuit configuration according to claim 3, which further comprises a control terminal for an input signal and a control terminal for an inverted input signal, and a fourth transistor having a gate connected to said control terminal for the input signal and a load path connected between said gate terminal of said second transistor and said control terminal for the inverted input signal, and said fourth transistor being p-conductive and being formed in said at least one well.

5. The MOS circuit configuration according to claim 3, wherein said voltage inverting circuit includes a capacitor having a first terminal connected to said terminal for the high positive voltage pulse and a second terminal, a fifth transistor connected as a diode with a polarity in the conducting direction between said second terminal of said capacitor and ground, and a sixth transistor connected as a diode with a polarity in the blocking direction, to an output terminal of said voltage-inverting circuit, and said fifth and sixth transistors being p-conductive and being formed in said at least one well.

6. The MOS circuit configuration according to claim 3, which further comprises a circuit configuration for switching high positive voltages, a seventh transistor connecting said output terminal to said circuit configuration for switching high positive voltages, and a control terminal for a control signal connected to a gate of said seventh transistor.

7. The MOS circuit configuration according to claim 1, which further comprises:

a terminal receiving an inverted input signal and a further control terminal receiving the input signal, a sixth transistor with a load path connected in parallel to a load path of said third transistor, a seventh transistor having a gate and a load path, and an eighth transistor having a gate and a load path;

said sixth transistor having a gate terminal connected through said load path of said eighth transistor to said terminal receiving the inverted input signal, said gate of said eighth transistor being connected to said further control terminal;

said load path of said seventh transistor being connected between said first terminal and said gate terminal of said sixth transistor, and said gate of said seventh transistor being connected to said output terminal; and said sixth and seventh transistors being p-conductive and being formed in at least one further n-well, and said eighth transistor being an n-conductive transistor.

8. The MOS circuit configuration according to claim 3, which further comprises a control terminal for an input signal and a control terminal for an inverted input signal, and a fourth transistor having a gate connected to said control terminal for the input signal and a load path connected between said gate terminal of said second transistor and said control terminal for the inverted input signal, and said fourth transistor being p-conductive and being formed in at least one further well.

9. The MOS circuit configuration according to claim 3, wherein said voltage inverting circuit includes a capacitor having a first terminal connected to said terminal for the high positive voltage pulse and a second terminal, a fifth transistor connected as a diode with a polarity in the conducting direction between said second terminal of said capacitor and ground, and a sixth transistor connected as a diode with a polarity in the blocking direction, to an output terminal of said voltage-inverting circuit, and said fifth and sixth transistors being p-conductive and being formed in at least one further well.

* * * * *